United States Patent
Chang

(10) Patent No.: US 7,038,184 B2
(45) Date of Patent: May 2, 2006

(54) IMAGE SENSOR WITH DIFFRACTION GRATING ARRAY

(75) Inventor: Jen-Tsorng Chang, Fullerton, CA (US)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/991,314

(22) Filed: Nov. 17, 2004

(65) Prior Publication Data

US 2005/0133689 A1  Jun. 23, 2005

(30) Foreign Application Priority Data

Dec. 19, 2003  (TW) .............................. 92222287 U

(51) Int. Cl.
*H01L 27/00* (2006.01)
*H01L 31/0232* (2006.01)

(52) U.S. Cl. .................................. 250/208.1; 257/432
(58) Field of Classification Search ............. 250/208.1; 257/432
See application file for complete search history.

(56) References Cited

U.S. PATENT DOCUMENTS 5,076,687 A * 12/1991 Adelson .................... 356/4.04
5,210,400 A * 5/1993 Usami ..................... 250/208.1

* cited by examiner

*Primary Examiner*—Kevin Pyo
(74) *Attorney, Agent, or Firm*—Morris Manning & Martin; Tim Tingkang Xia, Esq.

(57) ABSTRACT

An image sensor (100) includes a diffraction grating array (130), a microlens array (140), a light receiving cell (170), and a signal transacting circuit board (190). The diffraction grating array includes a plurality of round gratings. The light receiving unit includes a plurality of pixels which are arranged in a two-dimensional array. The diffraction grating array, the microlens array, the light receiving unit and the signal processing circuit board are arranged one above the other in that order from top to bottom. Each grating corresponds to a pixel vertically located therebelow. Light passes through the diffraction grating array, is then vertically incident on the microlens array, and is then incident on the light receiving unit, the light receiving unit converts receiving light signals into the electronic signals which is processed by the signal processing circuit board to form output signals. The image sensor is available for high quality of image.

16 Claims, 3 Drawing Sheets

IMAGE SENSOR WITH DIFFRACTION GRATING ARRAY

BACKGROUND OF THE INVENTION

1. Field of the Invention

The present invention relates to an image sensor, and more particularly to an image sensor for a device such as a digital camera module that is installed in portable electronic devices such as mobile phones and PDAs (Personal Digital Assistants).

2. Prior Art

Recently, there have been remarkable improvements in CPU (Central Processing Unit) performance and rapid developments in image processing technology. This has enabled electronic devices, such as mobile phones, PDAs and computers to be provided with excellent digital image processing capability. Furthermore, the transfer of image data between such devices is very popular, which has spurred the development of high quality image sensors used in image pickup apparatuses of these electronic devices. In the case of devices most frequently used for picking up images, the demand for high quality images is greatest.

Referring to FIG. 6, a conventional image sensor includes a cover 10, a microlens array 30, a color filter array 50, a light receiving unit 70 and a signal processing circuit board 90. The cover 10 is located in the front of the image sensor. The cover 10 is made from a sheet of glass or transparent resin, to prevent elements in the image sensor from being damaged by outside forces or contamination. The microlens array 30 includes a plurality of microlenses arranged in a two-dimensional matrix, to increase the amount of light entering the light receiving unit 70. The color filter array 50 typically includes red, green and blue filters (primary color filters) or cyan, magenta and yellow filters (complementary color filters), which are arranged to correspond to pixels of the light receiving unit 70, respectively, to obtain color information. A color image can be obtained by composing all of the output signals from the pixels. The light receiving unit 70 includes a plurality of pixels which are arranged in a two-dimensional array, each of the pixels having a photoelectric conversion element to generate a signal charge corresponding to the intensity of light received by each pixel. The signal processing circuit board 90 drives the pixels and processes the electronic signals produced by the pixels to form image output signals.

When the image sensor picks up an image, light passes through the cover 10 and is focused by the microlens array 30. Then the light passes through the color filter array 50 and enters the light receiving unit 70. The light receiving unit 70 converts the received light signals into the electronic signals, which are processed by the signal processing circuit board 90 to form image output signals.

Digital camera modules installed in portable electronic devices are becoming progressively more miniaturized. The image forming distance may be very short, such that an angle of incidence of peripheral incoming image light is quite large. After being focused by the microlens array 30, incoming light having the largest angle of incidence may be still incident upon an ineffective region of the light receiving unit 70. This results in a decrease in luminance of peripheral regions, which reduces the overall image quality.

Thus, a need exists for an image sensor which overcomes the above-described problems.

SUMMARY OF THE INVENTION

An object of the present invention is to provide an image sensor which can pick up high-quality images and which has a simple structure.

To accomplish the above-mentioned object, the present invention provides an image sensor which includes a diffraction grating array, a microlens array, a light receiving cell, and a signal transacting circuit board. The diffraction grating array includes a plurality of round gratings. The light receiving unit includes a plurality of pixels which are arranged in a two-dimensional array. The diffraction grating array, the microlens array, the light receiving unit and the signal processing circuit board are arranged one above the other in that order from top to bottom. Each grating corresponds to a pixel vertically located therebelow. Incoming light passes through the diffraction grating array, is then vertically incident on the microlens array, and is then incident on the light receiving unit, the light receiving unit converts receiving light signals into the electronic signals which is processed by the signal processing circuit board in order to form image output signals.

The image sensor of the present invention changes the light route of incident light by means of diffraction of the diffraction grating array. It allows light having large angles of incidence to be incident on an effective region of the light receiving unit. It increases the luminance of peripheral regions and improves image quality. Further, the image sensor has with a relatively simple structure, because the only additional component is the diffraction grating array.

Other objects, advantages and novel features of the present invention will be drawn from the following detailed description with reference to the attached drawings, in which:

DETAILED DESCRIPTION OF THE PREFERRED EMBODIMENT

Figure 1:
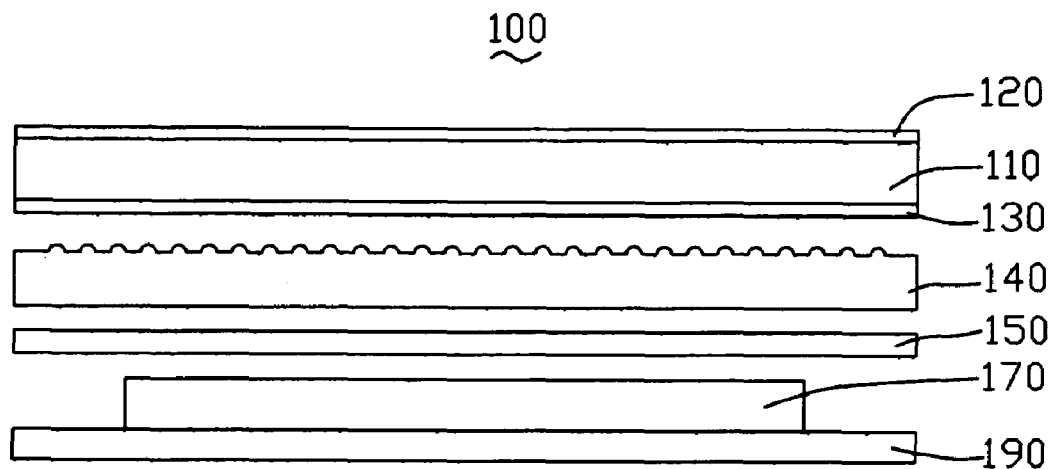
FIG. 1 is an exploded, schematic side cross-sectional view of an image sensor in accordance with the present invention, the image sensor including a diffraction grating array.

Referring to FIG. 1, an image sensor 100 for image picking-up of an electronic device like mobile phones in accordance with the present invention includes a cover 110, an infrared-filter film 120, a diffraction grating array 130, a microlens array 140, a color filter array 150, a light receiving unit 170 and a signal processing circuit board 190.

Figure 3:
FIG. 3 is a schematic, cross-sectional view of the diffraction grating array of the image sensor of FIG. 1.
Figure 4:
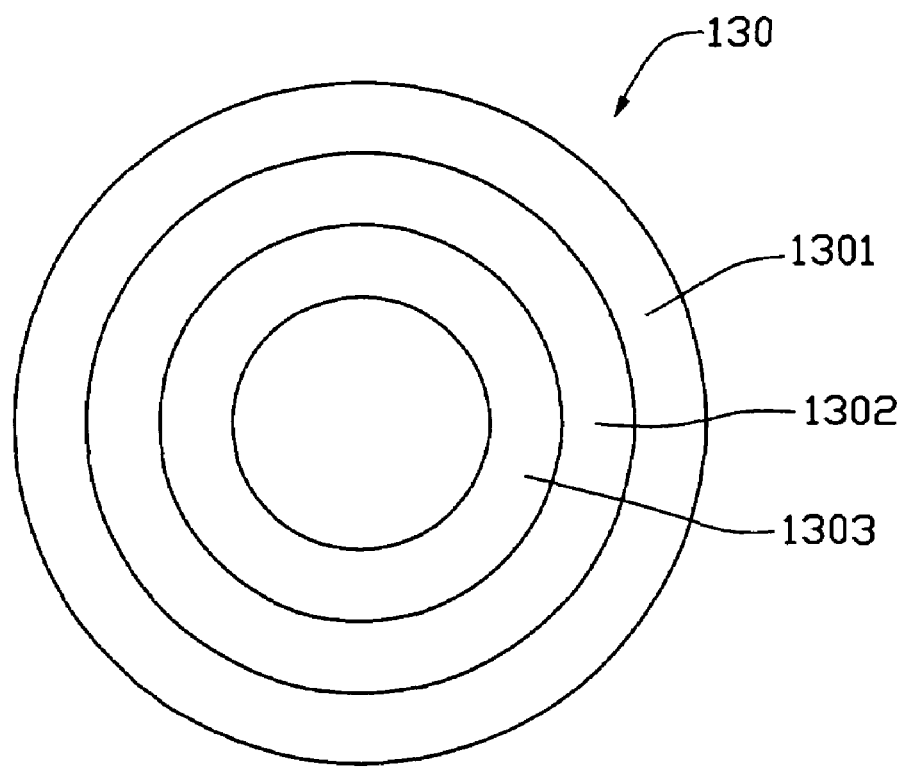
FIG. 4 is a schematic, top view of the diffraction grating array of the image sensor of FIG. 1.

The cover 110 is provided at the top of the image sensor 100. The cover 110 is typically made from a sheet of glass or transparent resin, and is for preventing elements in the image sensor 100 from being damaged by outside forces or contamination. The infrared-filter film 120 is plated on the top surface of the cover 110. The infrared-filter film 120 is a multilayer film for filtering out infrared light. The diffraction grating array 130 is attached to a bottom surface of the cover 110. The diffraction grating array 130 is made up of a plurality of round gratings with a same center. For example, the diffraction grating array 130 may comprise three round gratings 1301, 1302 and 1303, as shown in FIG. 3 and FIG. 4.

Figure 2:
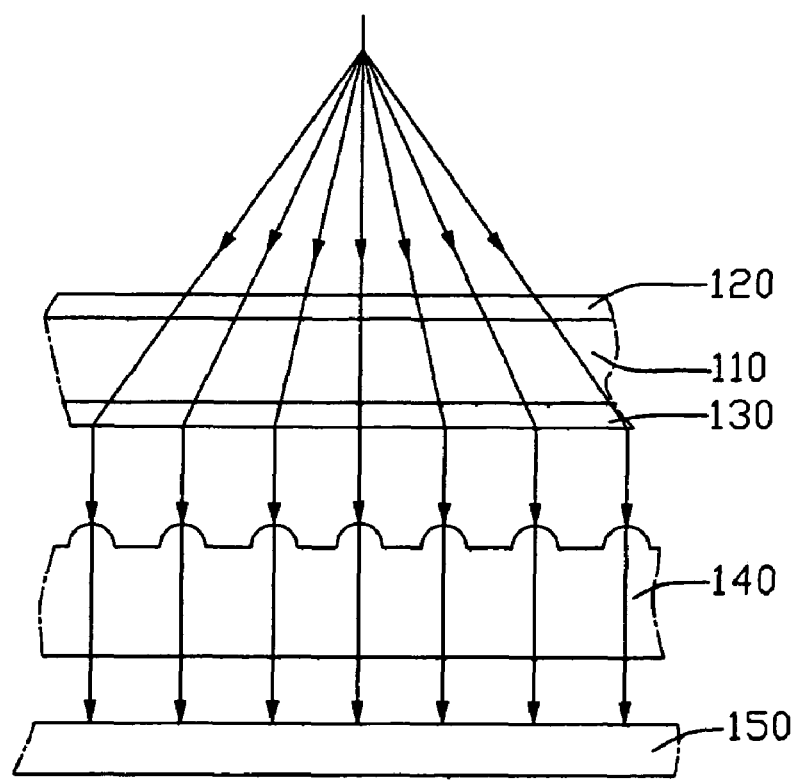
FIG. 2 is an enlarged view of part of the image sensor of FIG. 1, showing essential light routes thereof.
Figure 5:
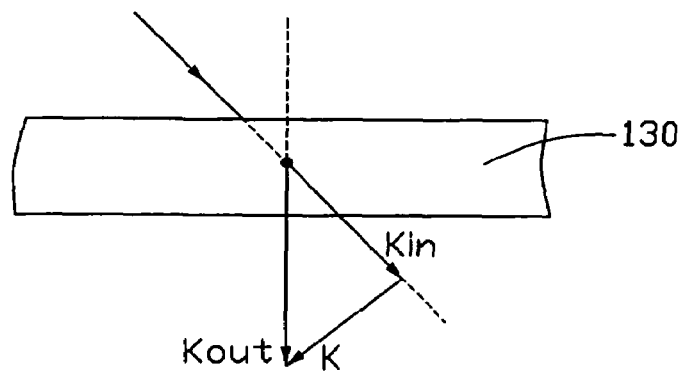
FIG. 5 is an enlarged view of the diffraction grating array of the image sensor of FIG. 1, showing light vectors thereof.
Figure 6:
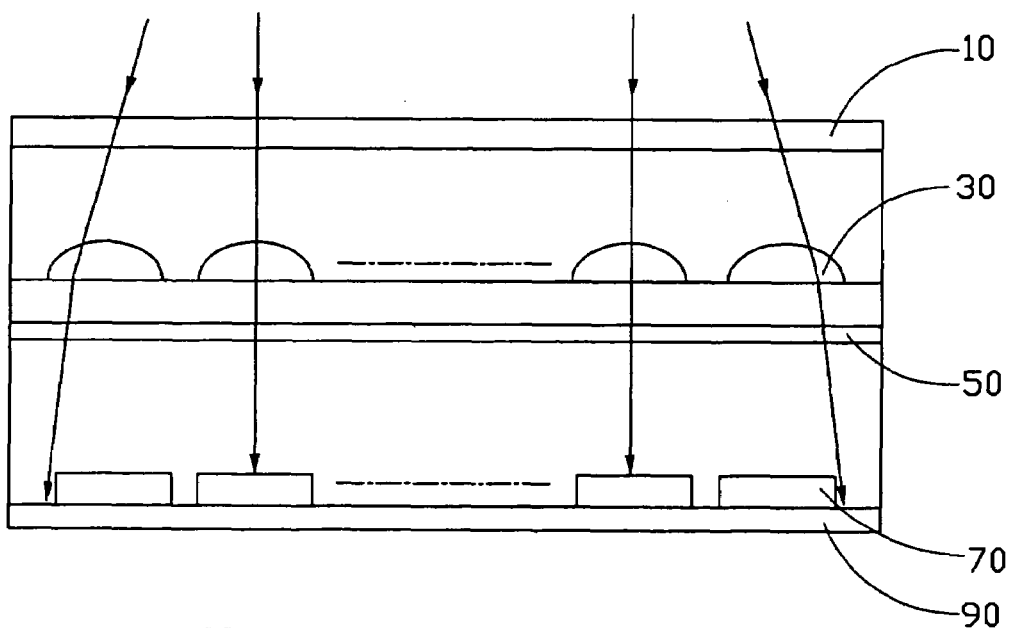
FIG. 6 is an exploded, schematic, side cross-sectional view of a conventional image sensor, showing essential light routes thereof.

The diffraction grating array 130 can change the light route of incident light. The diffraction grating array 130 is designed according to the largest incident angle of the light incident thereon. Light within the scope of the largest incident angle passes through the diffraction grating array 130 and is thus vertically incident on the microlens array 140. In this way, light with a large incident angle can enter an effective region of the light receiving unit 170. Each round grating 1301, 1302 and 1303 of the diffraction grating array 130 corresponds to a pixel vertically located therebelow. Therefore each round grating 1301, 1302 and 1303 has its own particular diffraction characteristic and optical parameter. The diffraction grating array 130 is based on coupling theory, and particularly on the light vector map of diffracted light. Referring to FIGS. 2 and 5, a vector of the incident light is $K_{in}$, and this is changed to $K_{out}$ as a result of the light passing through the diffraction grating array 130. According to the coupling theory, $K_{out}=K_{in}+K$. "K" is the vector of the round gratings 1301, 1302 or 1303, and can be the designing parameter of each round grating 1301, 1302 and 1303 of the diffraction grating array 130.

The microlens array 140 includes a multiplicity of microlenses arranged in a two-dimensional matrix, to increase the amount of light entering the light receiving unit 170.

The color filter array 150 is provided at a bottom side of the microlens array 140. The color filter array 150 includes red, green and blue filters (primary color filters) or cyan, magenta and yellow filters (complementary color filters). The filters are arranged to correspond to pixels of the light receiving unit 170 respectively, so that each pixel obtains corresponding color information. A color image can be obtained by composing all corresponding signals output from the pixels.

The light receiving unit 170 includes a multiplicity of pixels which are arranged in a two-dimensional array. Each of the pixels has a photoelectric conversion element to generate a signal charge corresponding to the intensity of light received by the pixel. Generally, each pixel in a CMOS (Complementary Metal Oxide Semiconductor) image sensor includes a photoelectric conversion element and a CMOS transistor, to generate a signal charge corresponding to an amount of received light.

The signal processing circuit board 190 includes a driving circuit for driving the pixels in order to obtain signal charges, an A/D (Analog/Digital) converter for converting signal charges to digital signals, and a digital signal processing unit for forming image output signals according to the digital signals.

In assembly of the image sensor 100 into a digital camera module, the image sensor 100 is located behind a lens of the camera, with the diffraction grating array 130 located on a focusing plane where the lens projects images on. When the image sensor 100 picks up an image, infrared light is filtered out from incoming light by the infrared-filter film 120. The remaining light passes through the cover 110 and images on the plane where the diffraction grating array 130 is. The route of the light is changed by the diffraction grating array 130 so that it is vertically incident on the microlens array 140. The light further passes through the color filter array 150, and is then directly incident on the light receiving unit 170. The light receiving unit 170 converts the received light signals into electronic signals. The signal processing circuit board 190 processes the electronic signals to form image output signals.

In an alternative embodiment, the color filter array 150 may be provided at a top side of the microlens array 140 instead of at the bottom side thereof. Further, if the image sensor 100 is not needed for color images, the color filter array 150 can be omitted.

It is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An image sensor for a digital camera module, comprising:
    a diffraction grating array, comprising a plurality of round gratings;
    a microlens array, comprising a plurality of microlenses arranged in a two-dimensional matrix;
    a light receiving unit, comprising a plurality of pixels arranged in a two-dimensional array; and
    a signal processing circuit board; wherein
    the diffraction grating array, the microlens array, the light receiving unit and the signal processing circuit board are arranged one above the other in that order from top to bottom, and each round grating corresponds to a pixel vertically located therebelow; and
    incoming light passes through the diffraction grating array, is then vertically incident on the microlens array, and is then incident on the light receiving unit, and the light receiving unit converts received light signals into electronic signals, and the signal processing circuit board processes the electronic signals in order to form image output signals.

2. The image sensor as claimed in claim 1, further comprising a cover provided above the diffraction grating array.

3. The image sensor as claimed in claim 2, wherein the cover is made from a sheet of glass or transparent resin.

4. The image sensor as claimed in claim 2, wherein an infrared-filter film is plated on a top surface of the cover.

5. The image sensor as claimed in claim 1, wherein the round gratings have a same center.

6. The image sensor as claimed in claim 5, wherein each round grating is designed according to the largest incident angle of light incident thereon.

7. The image sensor as claimed in claim 1, farther comprising a color filter array.

8. The image sensor as claimed in claim 7, wherein the color filter array includes red, green and blue filters, or alternatively cyan, magenta and yellow filters.

9. The image sensor as claimed in claim 7, wherein the color filter array is provided below the microlens array.

10. The image sensor as claimed in claim 7, wherein the color filter array is provided above the microlens array.

11. The image sensor as claimed in claim 1, wherein each of pixels of the light receiving unit comprises a photoelectric conversion element.

12. The image sensor as claimed in claim 1, wherein the signal processing circuit board comprises a driving circuit for driving the pixels in order to obtain signal charges, an A/D. (Analog/Digital) convener for converting signal charges to digital signals, and a digital signal processing unit for forming image output signals according to the digital signals.

13. An image sensor for image picking-up of an electronic device, comprising:

a lens array arranged in an incident path of an incident light from an outside of said electronic device so as to converge said incident light;

a light receiving unit arranged next to said lens array and spaced therefrom in a predetermined distance so as to accept illumination of said incident light after said incident light passes through said lens array, and generate corresponding image signals to said incident light; and means for diffracting said incident light arranged next to said lens array and opposite to said light receiving unit so as to diffract said incident light before said incident light reaches said lens array and said light receiving unit, wherein said means for diffracting said incident light is a diffraction grating array including a plurality of round gratings, each of which has its own particular diffraction characteristic and optical parameter and faces exclusively one microlens of said lens array and one pixel of said light receiving unit.

14. An image sensor for image picking-up of an electronic device, comprising:

a lens array for converging an incident light from an outside of said electronic device;

a light receiving unit arranged away from said lens array in a predetermined distance so as to accept illumination of said incident light after said incident light passes through said lens array, and generate corresponding image signals to said incident light; and means for altering an incident angle of said incident light relative to said lens array without separating said incident light into parts thereof, said means arranged at a side of said lens array opposite to said light receiving unit so as to alter said incident angle of said incident light before said incident light reaches said lens array and said light receiving unit, wherein said means for altering said incident angle of said incident light is a diffraction grating array.

15. The image sensor as claimed in claim 1, wherein each round grating has its own particular diffraction characteristic and optical parameter.

16. The image sensor as claimed in claim 14, wherein said diffraction grating array includes a plurality of round gratings, each of which has its own particular diffraction characteristic and optical parameter and faces exclusively one microlens of said lens array and one pixel of said light receiving unit.

\* \* \* \* \*